United States Patent [19]

Kawashima

[11] Patent Number: 5,111,136
[45] Date of Patent: May 5, 1992

[54] SEMICONDUCTOR CIRCUIT

[75] Inventor: Hiromi Kawashima, Yokohama, Japan

[73] Assignee: Fujitsu Limited, Kawasaki, Japan

[21] Appl. No.: 746,148

[22] Filed: Aug. 14, 1991

[30] Foreign Application Priority Data

Aug. 15, 1990 [JP] Japan ................ 2-215429

[51] Int. Cl.$^5$ ............................ G01R 31/28
[52] U.S. Cl. ................. 324/158 R; 307/362; 324/73.1; 324/158 T; 371/22.1
[58] Field of Search ........... 324/158 R, 158 T, 73.1; 307/362; 371/22.1

[56] References Cited

U.S. PATENT DOCUMENTS

| | | | |
|---|---|---|---|
| 4,398,146 | 8/1983 | Draheim et al. | 324/158 T |
| 4,550,289 | 10/1985 | Kabashima et al. | 324/158 R |
| 4,625,310 | 11/1986 | Mercer | 371/22.1 |
| 4,733,168 | 3/1988 | Blankenship et al. | 324/158 R |
| 4,742,486 | 5/1988 | Takamal et al. | 371/22.1 |
| 4,743,841 | 5/1988 | Takeuchi | 324/158 R |
| 4,764,924 | 8/1988 | Mate | 371/22.1 |
| 4,992,727 | 2/1991 | Simpson et al. | 371/22.1 |
| 5,017,809 | 5/1991 | Turner | 371/22.1 |
| 5,019,772 | 5/1991 | Dreibelbis et al. | 324/158 R |

FOREIGN PATENT DOCUMENTS 1-60789 12/1989 Japan .
3-42015 6/1991 Japan .

*Primary Examiner*—Kenneth A. Wieder
*Assistant Examiner*—William J. Burns
*Attorney, Agent, or Firm*—Armstrong, Nikaido, Marmelstein, Kubovcik & Murray

[57] ABSTRACT

A test mode input detection circuit for a semiconductor device comprises a first circuit including a group of transistors and a load element, the transistors and load element being connected in series between a power source and an input terminal, a node between the transistor group and the load element forming an output terminal of the first circuit; a second circuit including a transistor whose gate receives an output from the output terminal of the first circuit, and a transistor whose gate receives a power source voltage, these transistors being connected in series between the power source and a ground, a node between the transistors forming an output terminal of the second circuit; and an inverter circuit for providing a test mode signal in response to an output of the second circuit.

7 Claims, 3 Drawing Sheets

SEMICONDUCTOR CIRCUIT

BACKGROUND OF THE INVENTION

1. Field of the Invention

The present invention relates to a semiconductor circuit, and particularly to a test mode input detection circuit for a semiconductor device.

2. Description of the Related Art

For starting a special mode, for example a test mode or the like, semiconductor devices such as semiconductor memory devices employ a circuit to be activated only with a voltage that is higher than a normal input voltage.

FIG. 1 shows an example of a conventional test mode input detection circuit, wherein N-channel enhancement MOS transistors T1 to Tn have a short-circuited gate and drain and an n-channel depletion MOS transistor T11 has a short-circuited gate and source. These n+1 transistors are connected in series between an input terminal 10 of a usual circuit 20 and a ground.

Further an n-channel depletion MOS transistor T12 and an n-channel enhancement MOS transistor T13 are connected in series between a power source Vcc and the ground, to form an inverter. The gate of the transistor T13 is connected to a node N1 between the transistors Tn and T11, the gate of the transistor T12 is connected to the source thereof, and the source of the transistor T12 forms an output terminal $\overline{SIG}$.

The input terminal 10 serves a usual circuit 20 (not used in a test) of a semiconductor device. Namely, when a voltage VIN applied to the input terminal 10 is lower than a normal voltage, i.e., the power source voltage Vcc, the usual circuit 20 is activated and the test circuit is not activated. The test circuit is activated, when the voltage VIN applied to the input terminal 10 exceeds the normal voltage.

When each of the transistors T1 to Tn has a threshold voltage of Vth, a collective threshold voltage of the n series-connected transistors T1 to Tn is nVth. Namely, these transistors will not be turned ON unless a voltage higher than nVth is applied there to. When nVth > Vcc is established and when a normal voltage lower than the power source voltage Vcc is applied to the input terminal 10, the transistors T1 to Tn are turned OFF, the node N1 becomes low (L) level (ground level), and the output $\overline{SIG}$ becomes high (H) level, thereby establishing a non-test mode. If a semiconductor device connected to the test mode input detection circuit is a memory device, the non-test mode corresponds to a read/write mode.

When a high voltage (test voltage) VT higher than the power source voltage Vcc is applied to the input terminal 10, the transistors T1 to Tn are turned ON, and the node N1 provides a potential of VT minus nVth to the transistor T13. As a result, the transistor T13 is turned ON, and the output $\overline{SIG}$ is made L level for setting the test mode.

In this prior art, the test voltage VT applied to the input terminal 10 is, for example, 10 V, which is higher than the power source voltage Vcc of, for example, 5 V, for the normal operation. When the collective threshold voltage nVth fluctuates, the node voltage "VT minus nVth" is changed. If this node voltage is too low, the transistor T13 will not be turned ON, and the output $\overline{SIG}$ will not become L level, and as a result, the test mode will not be established.

If the collective threshold voltage nVth is too low, the transistors T1 to Tn may be turned on every by the power source voltage Vcc (which may also fluctuates) applied to the input terminal 10 for the normal mode, and accordingly, a current path will be formed from the input terminal 10 to the ground, to cause a leak current.

SUMMARY OF THE INVENTION

As object of the invention is to provide a semiconductor circuit that provides a certain mode signal, for example a test mode signal, when a voltage higher than a power source voltage is applied to an input terminal, is to erroneous activated by the power source voltage, and does not produce a leak current.

To accomplish the above objects, a semiconductor circuit according to the invention basically comprises:

a voltage detection circuit including;

a first circuit including a group of "n" transistors each having a threshold voltage of Vth, to provide a collective threshold voltage of nVth, and a load element, the transistors and load element being connected in series between a first power source line and an input terminal, a node between the transistor group and the load element forming an output terminal of the first circuit; and a second circuit including a first transistor having a gate which receives an output from the output terminal of the first circuit, and a second transistor having a gate which receives a power source voltage, the first and second transistors being connected in series between the first power source line and a second power source line a node between the first and second transistors forming an output terminal of the second circuit for outputting a detection signal.

DESCRIPTION OF THE PREFERRED EMBODIMENTS

A semiconductor circuit according to an embodiment of the invention will be explained in detail with reference to the drawings.

Figure 2:
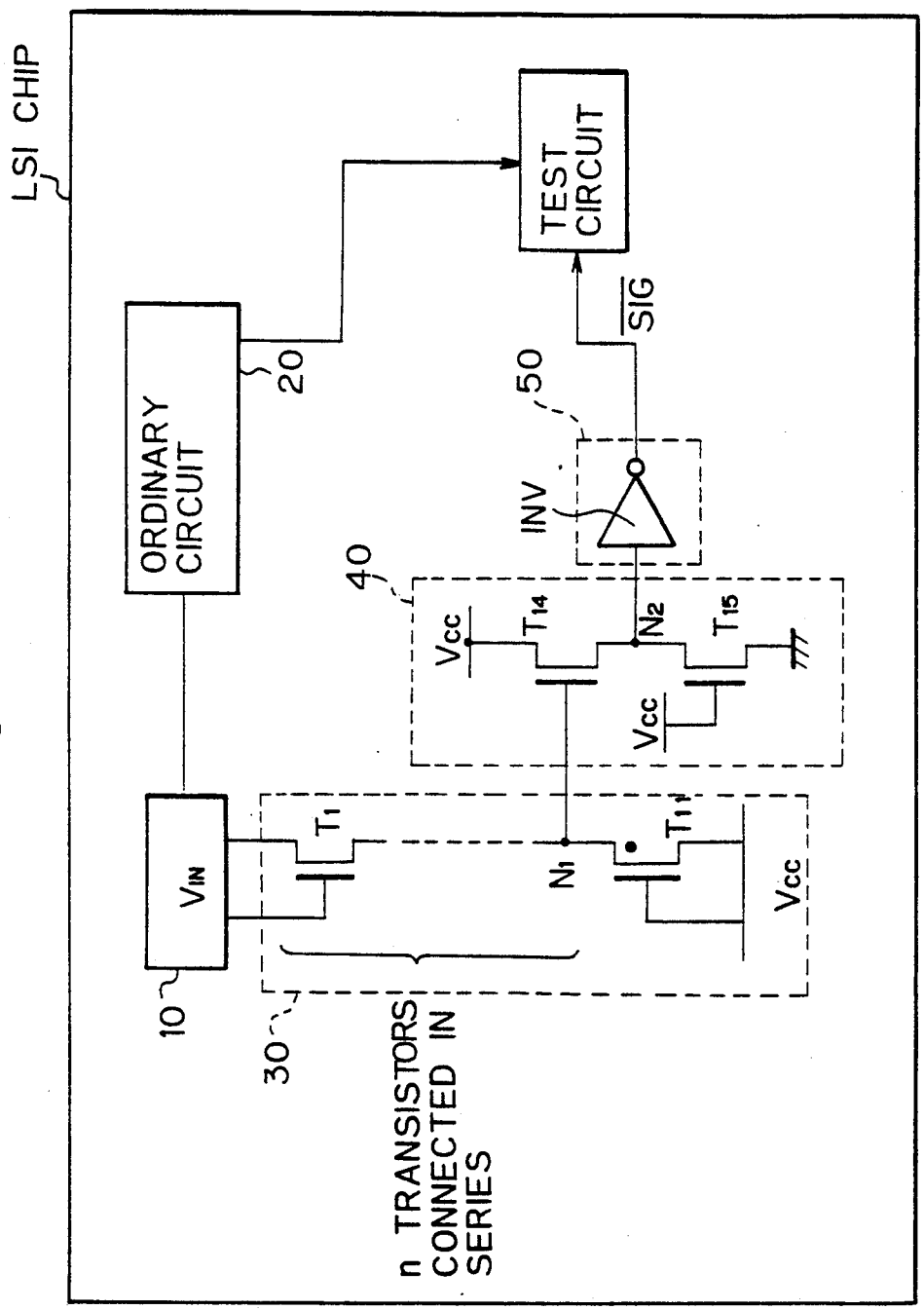
FIG. 2 is a circuit diagram showing a circuit according to the invention.

FIG. 2 is a circuit diagram showing the semiconductor circuit according to the invention. The semiconductor circuit comprises a voltage detection circuit including a first circuit 30, a second circuit 40, and a inverter (INV) 50.

The first circuit 30 includes a group of "n" transistors T1 to Tn each having a threshold voltage of Vth, and a load element 60 (T11). The transistor group and load element 60 are connected in series between a first power source line Vcc and an input terminal 10. A node between the transistor group and the load element forms an output terminal N1 of the first circuit 30.

The second circuit 40 includes a first transistor T14 whose gate receives an output from the output terminal N1 of the first circuit 30, and a second transistor T15 whose gate receives a first power source voltage Vcc. The first and second transistors T14 and T15 are connected in series between the first power source line and a second power source line, for example the ground. A node N2 between the first and second transistors T14 and T15 forms an output terminal of the second circuit 40.

The inverter (INV) 50 receives an output from the second circuit 40 and provides a certain mode signal, for example a test mode signal, $\overline{SIG}$.

Figure 1:
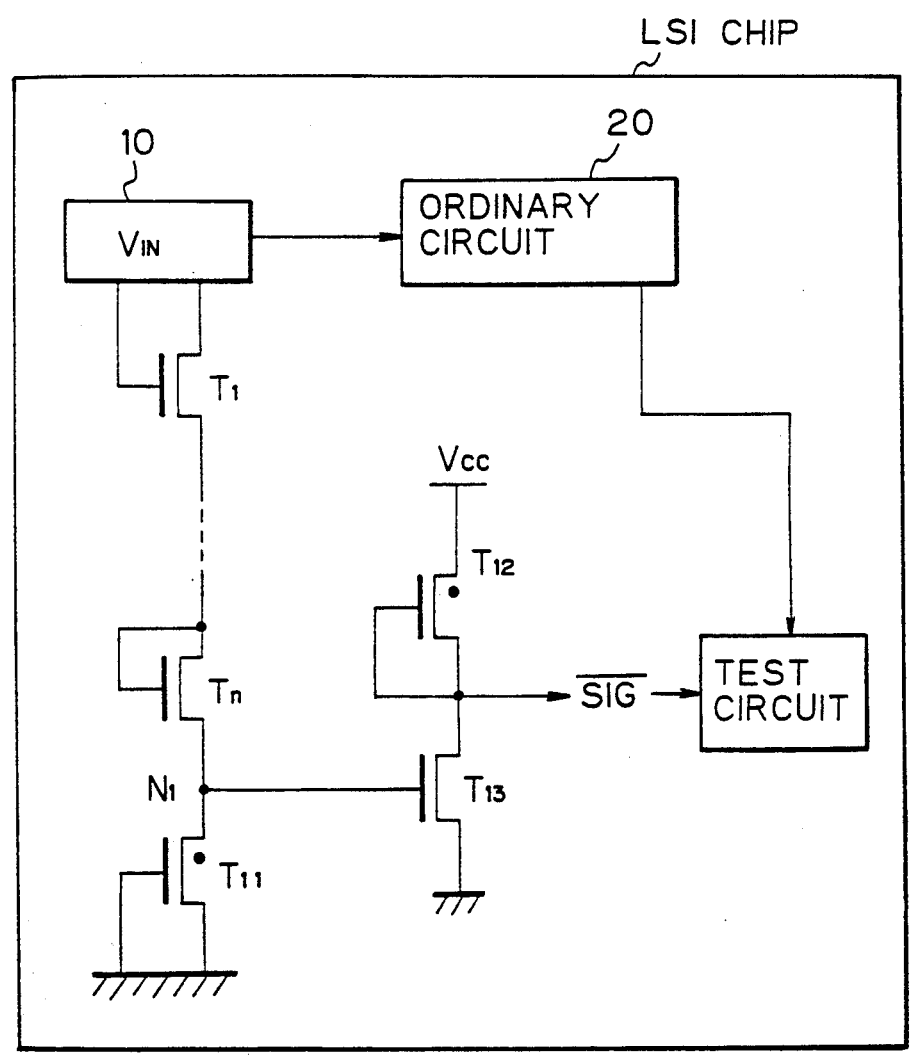
FIG. 1 is a circuit diagram showing a prior art.

In the prior art of FIG. 1, the gate and source of the transistor of T11 are connected to the ground. On the other hand, the gate and source of the transistor T11 of the invention are connected to the power source Vcc as shown in FIG. 2. The transistors T12 and T13 of FIG. 1 correspond to the first and second transistors T14 and T15 of the invention which are n-channel enhancement MOS transistors. The gate of the first transistor T14 is connected to the node N1, and the gate of the second transistor T15 is connected to the power source Vcc. Unlike the prior art of FIG. 1, the node N2 between the first and second transistors T14 and T15 of the invention does not provide the test mode signal $\overline{SIG}$. Instead, the inverter (INV) 50 receives an output from the node N2 and provides the test mode signal $\overline{SIG}$.

The transistors employed in the first circuit 30 of the semiconductor circuit according to the invention are preferably "n" pieces of enhancement MOS transistors T1 to Tn each having short-circuited gate and drain. This, however, does not limit the invention, and any tansistors that provide the same function as above may be employed.

In FIG. 2, the load element 60 in the first circuit 30 is a depletion MOS transistor T11 having short-circuited gate and source. Since this load element is always in an ON state to serve as a resistor, it may be simply replaced with a resistor.

The second circuit 40 according to the invention has a voltage changing function. Namely, in response to an output of the first circuit 30, the second circuit 40 selectively provides an output voltage that exceeds a threshold voltage of the inverter 50, or an output voltage that does not exceed the same.

In FIG. 2, the second circuit 40 comprises the first and second transistors T14 and T15 connected in series. The kinds of these transistors T14 and T15 are not particularly limited. Preferably, the transistors T14 and T15 are of the same type and size.

The sizes of the first and second transistors T14 and T15 of the second circuit 40 are determined such that, when the first circuit 30 provides the second circuit 40 with a voltage higher than the power source voltage Vcc, the second circuit provides the inverter 50 with a voltage higher than the threshold voltage of the inverter 50.

A ratio L/W of the gate length L and the gate width W of each of the transistors T14 and T15 is determined such that, when the gate voltage of the first transistor T14 is Vcc, the output node N2 of the second circuit 40 becomes L level, and when the gate voltage of the first transistor T14 is lower than the power source voltage Vcc, the output node N2 of the second circuit 40 becomes H level.

In FIG. 2, the source potential of the transistor T11 is Vcc, so that the transistors T1 to Tn (Tn is not shown) are not turned ON when a voltage lower than Vcc is applied to the input terminal 10, and therefore, no leak current flows through the first circuit 30 under the normal mode.

To establish the test mode, a voltage of $Vcc + \alpha (\alpha > 0)$ is applied to the input terminal 10 to turn ON the transistors T1 to Tn and increase a potential at the node N1. At this time, the ON state of the first transistor T14 of the second circuit 40 is strengthened, the node N2 of the second circuit 40 becomes H level, and the output $\overline{SIG}$ of the inverter INV becomes L level for the test mode. In this way, the voltage $Vcc + \alpha$ surely establishes the test mode.

Since no leakage occurs if a voltage applied to the input terminal 10 is below Vcc, the number of the series-connected transistors T1 to Tn may be reduced. If the number is reduced, the potential "VT minus nVth" at the node N1 is high at the time of testing. Namely, even if the collective threshold nVth slightly fluctuates, the node N1 becomes sufficiently H level, and accordingly, the node N2 becomes sufficiently H level, to thereby provide the test mode signal $\overline{SIG}$.

In the present invention, the semiconductor circuit as explained above, further includes an ordinary circuit detection circuit can detect an abnormal voltage which applied to the input terminal the input voltage of which falls outside of a normal signal voltage range and it outputs a detection signal thereof.

And moreover, the semiconductor circuit of the present invention, further includes a mode circuit which is activated in response to the detection signal.

EXAMPLE

The circuit of FIG. 2 will be explained in more detail. The transistors T1 to Tn are n-channel enhancement MOS transistors each having a short-circuited gate and drain, and the transistor T11 is an n-channel depletion MOS transistor having a short-circuited gate and source. The transistors T1 to Tn and T11 are connected in series. The gate and drain of the transistor T1 are connected to the input terminal 10, and the gate and source of the transistor T11 are connected to the power source Vcc. The node N1 between the transistors Tn (not shown) and T11 is the output terminal of the first circuit 30.

The first and second transistors T14 and T15 of the second circuit 40 are n-channel enhancement MOS transistors connected in series between the power source Vcc and the ground. The node N2 between the series connected transistors T14 and T15 is the output terminal of the second circuit 40. The gate of the first transistor T14 is connected to the output terminal N1 of the first circuit 30, and the gate of the second transistor T15 is connected to the power source Vcc. An output of the node N2 is inverted by the inverter INV and provided as the test mode signal $\overline{SIG}$.

A ratio L/Wj of the gate length L and the gate width W of each of the first and second transistors T14 and T15 of the second circuit 40 is designed such that an output of the node N2 becomes L level when the gate voltage of the first transistor T14 is Vcc. In this case, the first and second transistors T14 and T15 have the same gate voltage of Vcc, with which the second transistor T15 shows lower resistance than the first transistor T14, so that a divided voltage of the power source voltage Vcc appearing at the node N2 may be lower than the threshold voltage of the inverter INV.

Figure 3:
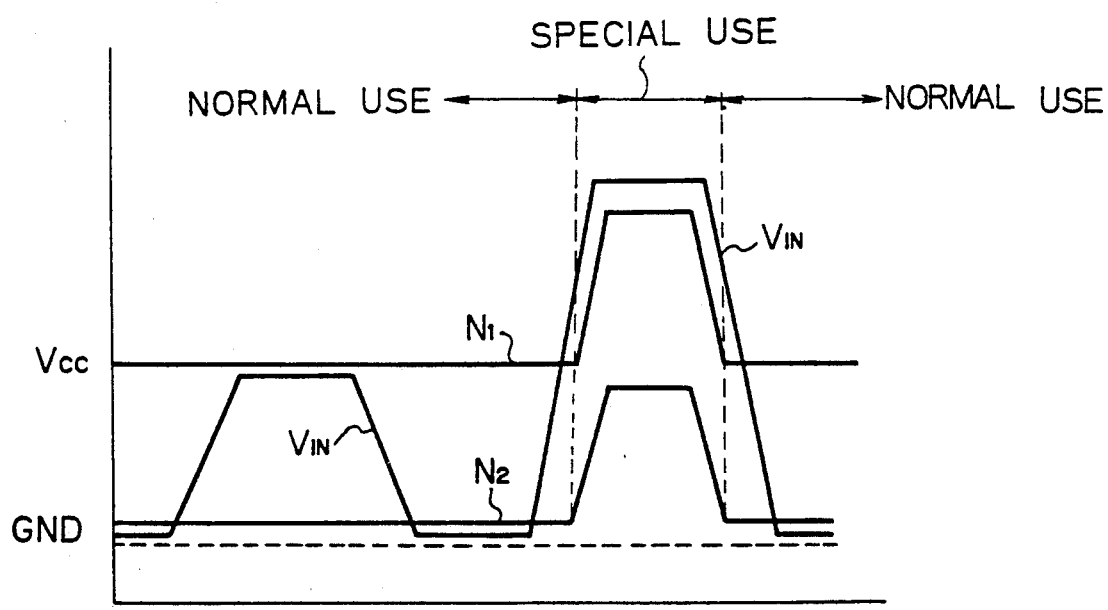
FIG. 3 is a waveform diagram showing an operation of the present invention.

In FIG. 3, when the input terminal 10 receives a normal voltage VIN(N) which is lower than the power source voltage Vcc, the transistors T1 to Tn are turned OFF so that the node N1 provides the power source voltage Vcc. At this time, the node N2 becomes L level (GND), and the output signal $\overline{SIG}$ H level.

When a test voltage VIN(T) higher than the power source voltage Vcc is applied to the input terminal 10, the transistors T1 to Tn are turned ON, and the node N1 provides a voltage of "VIN(T) minus nVth." This voltage at the node N1 is higher than Vcc, so that the first transistor T14 of the second circuit 40 becomes more conductive to increase a voltage at the node N2, i.e., a voltage divided from the power source voltage Vcc by the first and second transistors T14 and T15. As a result, the signal $\overline{SIG}$ becomes L level for the test mode.

In this circuit, one ends of the series-connected transistors T1 to Tn and T11 connected to the input terminal 10 receive VIN, and the other ends thereof the power source voltage Vcc, so that the transistors T1 to Tn will not be turned ON unless VIN>Vcc is satisfied leak current never flows, therefore, while the input terminal 10 is receiving the normal voltage below Vcc. To establish the test mode, voltage VIN=Vcc+α(α>0) must be applied to the input terminal 10.

Since there is no risk of a leak current, the number of the transistors T1 to Tn may be reduced. This reduction may increase the voltage "VT minus nVth" at the node N1. As a result, the node N2 attains H level even if the collective threshold voltage nVth slightly fluctuates, and the output $\overline{SIG}$ surely becomes L level.

A ratio L/W of the gate length L and the gate width W of each of the first and second transistors T14 and T15 of the second circuit 40 must be designed to bring the potential at the output node N2 of the second circuit 40 to L level with the normal voltage. One of the L and W may be fixed so that the transistors with stand processing fluctuations.

Since the transistor T11 serves as a load for the transistors T1 to Tn, it may be replaced with a resistor. A resistance ratio of the first and second transistors T14 and T15 is important, and thus these transistors may be a depletion type instead of an enhancement type.

I claim:

1. A semiconductor circuit comprising:
    a first circuit including a group of "n" transistors each having a threshold voltage of Vth to provide a collective threshold voltage of nVth, and a load element, the transistors and load element being connected in series between a power source and an input terminal, a node between the transistor group and the load element forming an output terminal of the first circuit;
    a second circuit including a first transistor whose gate receives an output from the output terminal of the first circuit, and a second transistor whose gate receives a power source voltage, the first and second transistors being connected in series between the power source and a ground, a node between the first and second transistors forming an output terminal of the second circuit; and
    an inverter circuit for providing a test mode signal in response to an output of the second circuit.

2. A semiconductor circuit as set forth in claim 1, wherein the n transistors of the transistor group of the first circuit are n enhancement MOS transistors each having a short-circuited gate and drain.

3. A semiconductor circuit as set forth in claim 1, wherein the load element of the first circuit is a depletion MOS transistor having a short-circuited gate and source.

4. A semiconductor circuit as set forth in claim 1, wherein the size of each of the first and second transistors of the second circuit is determined such that, when a voltage higher than the power source voltage is applied to the input terminal, the second circuit provides an output voltage higher than a threshold voltage of the inverter.

5. A semiconductor circuit as set forth in claim 1, wherein the load element of the first circuit is a resistor.

6. A semiconductor circuit as set forth in claim 1, wherein said semiconductor circuit further includes an ordinary circuit which is connected to said input terminal, and said voltage detection circuit detecting an abnormal voltage outside a normal signal voltage range and applied to said input terminal and outputting a detection signal thereof.

7. A semiconductor circuit as set forth in claim 6, wherein said semiconductor circuit further includes a mode circuit which is activated in response to said detection signal.

* * * * *